(12) United States Patent
Pfeifer et al.

(10) Patent No.: US 10,394,294 B2
(45) Date of Patent: Aug. 27, 2019

(54) PREDICTIVE THERMAL CONTROL MANAGEMENT USING TEMPERATURE AND POWER SENSORS

(71) Applicant: Microchip Technology Incorporated, Chandler, AZ (US)

(72) Inventors: Erick Pfeifer, Austin, TX (US); Kyle Gaede, Austin, TX (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 1 day.

(21) Appl. No.: 15/685,719

(22) Filed: Aug. 24, 2017

(65) Prior Publication Data
US 2018/0059747 A1    Mar. 1, 2018

Related U.S. Application Data

(60) Provisional application No. 62/379,688, filed on Aug. 25, 2016.

(51) Int. Cl.
| | |
|---|---|
| *G06F 1/20* | (2006.01) |
| *G06F 1/32* | (2019.01) |
| *G06F 1/3206* | (2019.01) |
| *G06F 1/3234* | (2019.01) |
| *H05K 7/20* | (2006.01) |
| *G01K 7/42* | (2006.01) |

(52) U.S. Cl.
CPC .............. *G06F 1/206* (2013.01); *G06F 1/325* (2013.01); *G06F 1/3206* (2013.01); *H05K 7/20209* (2013.01); *H05K 7/20836* (2013.01); *G01K 7/425* (2013.01); *G06F 2200/201* (2013.01); *Y02D 10/16* (2018.01)

(58) Field of Classification Search
CPC ........ G06F 1/206; G06F 1/3206; G06F 1/325; G06F 2200/201; G01K 7/425; H05K 7/20209; H05K 7/20836
USPC ......................................................... 700/299
See application file for complete search history.

(56) References Cited

U.S. PATENT DOCUMENTS

| 6,182,232 | B1 | 1/2001 | Klein | ............................ 713/340 |
| 8,812,166 | B2 * | 8/2014 | Wang | .................... G06F 9/5011 |
| | | | | 700/295 |
| 9,450,492 | B1 * | 9/2016 | Bizjak | ................... H02M 3/156 |
| 2003/0230939 | A1 * | 12/2003 | Hu | .......................... G06F 1/206 |
| | | | | 307/117 |

(Continued)

OTHER PUBLICATIONS

International Search Report and Written Opinion, Application No. PCT/US2017/048640, 12 pages, dated Nov. 20, 2017.

*Primary Examiner* — Brian W Wathen
*Assistant Examiner* — Olvin Lopez Alvarez
(74) *Attorney, Agent, or Firm* — Slayden Grubert Beard PLLC (57) ABSTRACT

Embodiments of the present disclosure include a microcontroller configured to cool an electronic device. The microcontroller is configured to receive a power consumption value of the electronic device, determine, based on the power consumption value and a stored previous power consumption value, a change value representing an amount that power consumption of the electronic device changed from a previous power consumption of the electronic device, determine an output cooling control value based at least in part on the change value, and control an output for cooling the electronic device using the output cooling control value.

23 Claims, 5 Drawing Sheets

(56) References Cited

U.S. PATENT DOCUMENTS

| | | | | |
|---|---|---|---|---|
| 2004/0207377 A1* | 10/2004 | Shimada | H02M 3/158 323/284 | |
| 2004/0257013 A1 | 12/2004 | Chhleda et al. | 318/268 | |
| 2006/0108962 A1 | 5/2006 | Murray et al. | 318/610 | |
| 2008/0059001 A1* | 3/2008 | Artman | G06F 1/206 700/299 | |
| 2011/0224837 A1* | 9/2011 | Moss | G06F 1/206 700/295 | |
| 2011/0231030 A1* | 9/2011 | Carter | G05D 23/1919 700/300 | |
| 2012/0010754 A1* | 1/2012 | Matteson | H05K 7/20836 700/282 | |
| 2012/0131363 A1* | 5/2012 | Hsu | G05D 23/19 713/320 | |
| 2012/0224878 A1* | 9/2012 | Ikebuchi | G03G 15/2039 399/70 | |
| 2013/0117590 A1* | 5/2013 | Allen-Ware | G06F 1/206 713/320 | |
| 2013/0345893 A1* | 12/2013 | David | G05D 23/00 700/300 | |
| 2014/0021266 A1* | 1/2014 | Perez Gellida | G05D 23/1919 236/101 R | |
| 2014/0114496 A1* | 4/2014 | Berry | H05K 7/20836 700/299 | |
| 2014/0117908 A1* | 5/2014 | Busch | H02P 1/04 318/471 | |
| 2014/0379889 A1* | 12/2014 | Faraboschi | H04L 41/0823 709/224 | |
| 2015/0277520 A1* | 10/2015 | Neumann | G06F 1/206 713/320 | |
| 2015/0333681 A1* | 11/2015 | Matsuki | H02P 21/06 318/400.02 | |
| 2015/0378403 A1* | 12/2015 | Chen | H05K 7/20209 700/282 | |
| 2015/0378404 A1* | 12/2015 | Ogawa | G06F 1/206 700/300 | |
| 2016/0274629 A1* | 9/2016 | Lovicott | G06F 1/206 | |
| 2018/0032114 A1* | 2/2018 | Hovis | G05B 15/02 | |
| 2018/0054918 A1* | 2/2018 | Wang | H05K 1/0203 | |

* cited by examiner

PREDICTIVE THERMAL CONTROL MANAGEMENT USING TEMPERATURE AND POWER SENSORS

RELATED APPLICATIONS

This application claims priority to U.S. Provisional Application 62/379,688, filed Aug. 25, 2016, the contents of which are hereby incorporated in their entirety.

TECHNICAL FIELD

The present disclosure relates to electrical power control systems. More particularly, the disclosure relates to power control systems and methods for reducing power consumption of an electric fan in an air cooling system.

BACKGROUND

The heat generated by electronic devices during operation is dissipated in a variety of ways. Cooling systems using, for example, air, fluid, or heat sinks may be attached to or integrated into the electronic device. Cooling systems for electronic devices often themselves include electronic components that aid in dissipating heat. The most common such component is an electric fan, which cools the electronic device by movement of air. Another exemplary component is a fluid pump that moves fluid through tubes and across the electronic device. Of course, powered cooling systems consume electric power and incur corresponding utility costs.

SUMMARY

The present disclosure provides an apparatus that reduces average power consumption or usage of a cooling system for an electronic device, by decreasing power consumption of one or more components of the cooling system when the power usage of the electronic device decreases. In one aspect of the disclosure, the apparatus includes a power sensor that periodically detects power consumption or usage of an electronic device and produces a power usage value representing the detected power usage, and a microcontroller in electronic communication with the power sensor and with a fan rotating at a first fan speed and blowing air onto the electronic device. The microcontroller receives the power usage value and executes stored program instructions to: determine, based on the power usage value and a stored previous power usage value, a reduction value representing an amount that the power usage of the electronic device decreased from a previous power usage of the electronic device; determine a second fan speed based at least in part on the first fan speed and the reduction value, the second fan speed being lower than the first fan speed; and control the fan to rotate at the second fan speed. In some embodiments, the microcontroller may further be in electronic communication with a temperature sensor that periodically detects temperature of the electronic device and produces a temperature value representing the detected temperature, and the microcontroller may receive the temperature value and determine the second fan speed further based on the temperature value.

In another aspect of the disclosure, a method for reducing power consumption of a cooling system for an electronic device is described. The method may be implemented in a controller of the cooling system, and includes: receiving a first power usage value from a power sensor, the first power usage value representing power usage of the electronic device at a first time; receiving a second power usage value from a power sensor, the second power usage value representing power usage of the electronic device at a second time subsequent to the first time; receiving a temperature value from a temperature sensor, the temperature value representing a temperature of the electronic device at the second time; receiving a first fan speed value representing a rotation speed of a fan of the cooling system at the second time; determining, from the first power usage value and the second power usage value, a reduction value representing an amount that the power usage of the electronic device decreased from the first time to the second time; determining, from the reduction value, the temperature value, and the first fan speed value, a second fan speed lower than the first fan speed; and controlling the fan to rotate at the second fan speed.

In the above aspects, the fan speed is reduced in a predictive manner: when the electronic device begins to use less power, it produces less thermal energy. Thus, the fan does not have to run as strongly to cool the electronic device; the fan speed can be reduced without allowing the temperature to increase in the target electronic device. The slower fan speed translates to less power consumption by the fan. Correspondingly, the overall power consumption of the cooling system is reduced. To complement these aspects, the disclosure further provides systems and methods for increasing the fan speed when a power usage increase is detected in the electronic device. Additional and alternative embodiments of the microcontroller can provide the same power management of other cooling system components (e.g., a fluid pump or air conditioning unit) as is disclosed for a fan. The foregoing and other advantages of the disclosure will appear from the following description.

Embodiments of the present disclosure include a power controller comprising instructions. The instructions, when loaded and executed by a processor, cause the processor to receive a power consumption value indicating power consumption of an electronic device, determine, based on the power consumption value and a stored previous power consumption value, a change value representing an amount that power consumption of the electronic device changed from a previous power consumption of the electronic device. The processor may be further caused to determine an output cooling control value based at least in part on the change value. The processor may be further caused to control an output for cooling the electronic device using the output cooling control value. In combination with any of the above embodiments, the output cooling control value may be a fan speed. In combination with any of the above embodiments, the processor may be caused to cool the electronic device during the previous power consumption at a first fan speed.

In combination with any of the above embodiments, the change value may be a reduction in power consumption. In combination with any of the above embodiments, the output cooling value may represent a second fan speed lower than the first fan speed. In combination with any of the above embodiments, the change value may be an increase in power consumption and the output cooling value represents a second fan speed higher than the first fan speed. In combination with any of the above embodiments, the change value is a reduction in power consumption, and the output cooling value represents a second fan speed lower than the first fan speed, and the processor received temperature data indicating that the temperature had not decreased during the previous power consumption. In combination with any of the above embodiments, the processor may be further caused to determine the output cooling control value based at least in part on the change value and temperature of the electronic device. In combination with any of the above embodiments, the processor may be further caused to determine the output cooling control value using a proportional-integrative-derivative control loop. In combination with any of the above embodiments, the processor may be further caused to determine the output cooling control value using a proportional-integrative-derivative (PID) control loop and use the change value to adjust an integrative accumulator of the PID control loop. In combination with any of the above embodiments, the processor may be further caused to predict a temperature change in advance of an actual temperature change using the change value.

Embodiments of the present disclosure may also include microcontrollers including any of the above power controllers, or methods performed by the microcontrollers or power controllers.

DETAILED DESCRIPTION

The present disclosure provides systems and methods for controlling the power consumption of one or more components of a cooling system for an electronic device. The systems and methods can be implemented for many different types of electronic devices that generate thermal energy or are susceptible to temperature and must be cooled during operation. References to the electronic device being a server or other type of computing device are for purposes of example only and do not limit the applicability and adaptation of the present disclosure to suit other electronic devices. Similarly, while reference is made for descriptive purposes to controlling the power consumption or speed of a fan, the present disclosure is applicable to other types of cooling system components that consume power in order to operate within the cooling system.

Figure 1:
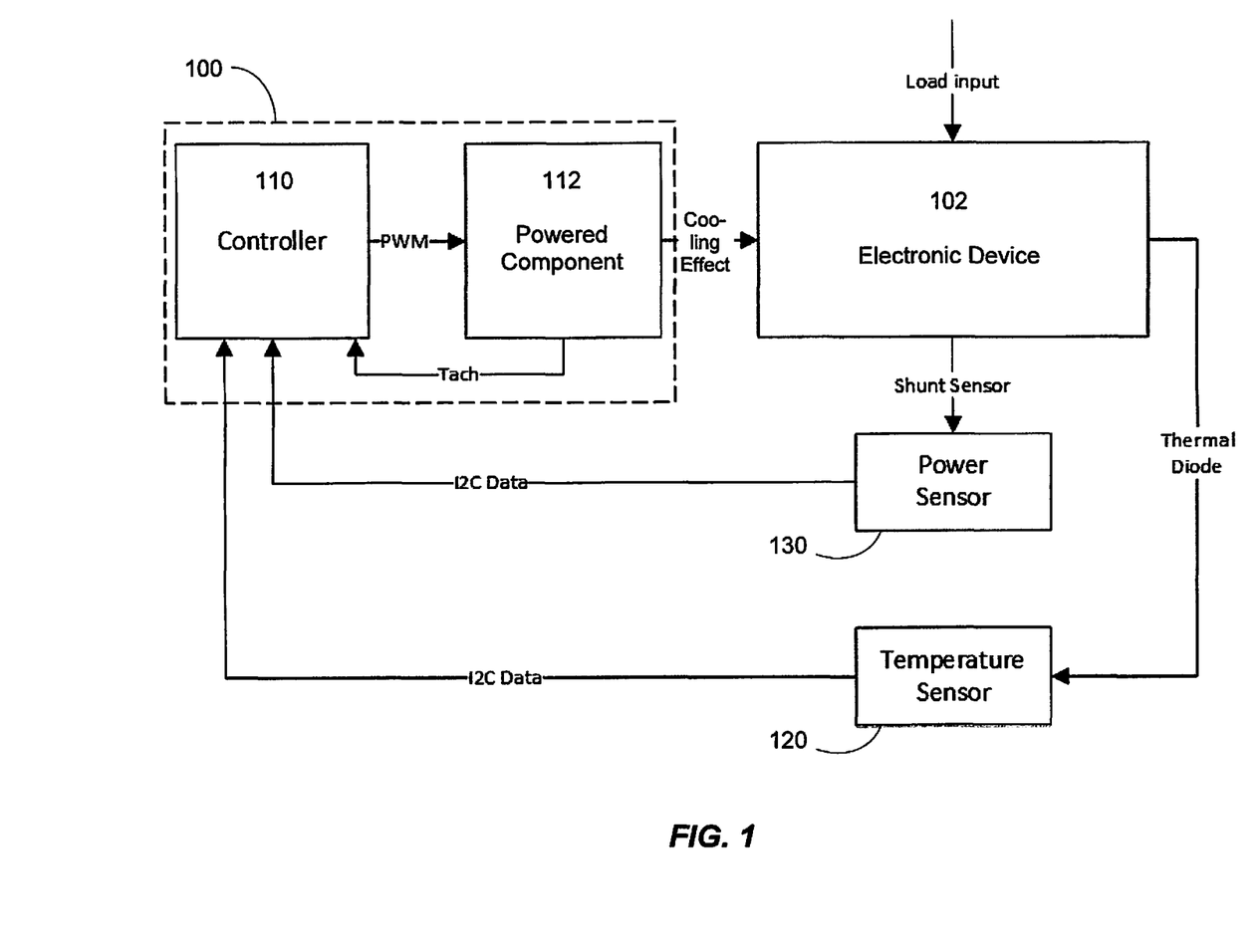
FIG. 1 is a block diagram illustrating a cooling system, according to embodiments of the present disclosure.

FIG. 1 is a block diagram illustrating a cooling system 100, according to embodiments of the present disclosure. Cooling system 100 may be configured to apply a cooling effect to a target, such as an electronic device 102. The cooling effect may include, for example, air or liquid cooling.

Cooling system 100 may include a controller 110 configured to control the operation of one or more units that perform the cooling effect. The units that perform the cooling effect may include powered cooling components 112. Powered cooling components 112 may include a fan, pump, air conditioner, or liquid injection unit and may be implemented through any suitable combination of analog and digital circuitry to effect a physical cooling. Controller 110 may be implemented in any suitable combination of analog and physical circuitry, such as a suitable microprocessor, microcontroller, control board, or other computing device having input and output interfaces for communicating with other devices, as well as memory or other storage for program logic/instructions that the controller 110 executes to send and receive signals and process data. Powered cooling components 112 may be components configured to consume power, and further the powered cooling components 112 directly or indirectly provide the cooling effect to the electronic device 102.

In some embodiments, the controller 110 manages powered cooling component 112 by transmitting program instructions that the powered cooling component 112 executes. Additionally or alternatively, controller 110 may control the powered component by pulse-width modulation (PWM), which may be in the form of a PWM signal or through direct PWM of powered component's 112 power supply or current. Powered cooling component 112 may be actuated by the control signal and operate according to the control signal parameters. For example, a fan's rotation speed may be determined by the pulse width or period of a PWM signal: a shorter pulse width may case the fan to rotate slower. Correspondingly, the power consumption of the powered cooling component 112 changes according to the control signal. Using the fan example, a shorter pulse that causes the fan to spin slower also causes the fan to use less current during operation. Controller 110 may apply the control signal to the powered cooling component 112 continuously, at predetermined intervals, or only when the controller 110 changes a parameter of the control signal.

Controller 110 may process one or more inputs in order to determine the parameters of the control signal. One or more inputs may be provided by powered cooling component 112 itself. For example, controller 110 may obtain the present (i.e. real-time) or a previously-recorded fan speed or a rate or other value describing component's 112 power consumption. The previously-recorded fan speed may be stored in memory or a look-up table. Controller 110 may additionally or alternatively receive, as inputs, data describing the real-time or past operation of electronic device 102. One such input may include a temperature value produced by one or more temperature sensors 120. Temperature sensor 120 may be configured to monitor the temperature of electronic device 102. Controller 110 may update the control signal to increase the cooling effect if the temperature is rising or is at a certain threshold, or to decrease the cooling effect if the temperature value is in an acceptable range.

In one embodiment, controller 110 may be configured to utilize a power usage of electronic device 102 in determining how to operate powered cooling component 112. Controller 110 may receive a measurement of power usage from one or more power sensors 130. Power sensor 130 may be configured to measure or monitor the instantaneous power usage of electronic device 102. The instantaneous power usage value may represent, for example, the real-time current flow through or to electronic device 102. The instantaneous power usage value may represent another characteristic of power consumption of electronic device 102, such as watts used. As described further below, controller 110 may be configured to evaluate the present power usage of the electronic device 102 in light of historic power usage information accessible by controller 110. The historic power usage information may include or be derived from previously recorded power usage values, which may be stored and retrieved by controller 110 in an onboard memory or an external memory. Controller 110 may be configured to produce an evaluation result that, alone or in combination with other inputs, indicates that the control signal to powered cooling component 112 can be changed to reduce powered component's 112 power consumption.

For example, controller 110 may determine that the present power usage of electronic device 102 is lower than a previous value, changing in the negative direction, and is therefore decreasing. Controller 110 may, for example, alter the pulse width in the control signal to slow down the fan speed in accordance with the decreased power usage of electronic device 102 on the expectation that less cooling effect is needed because electronic device 102 is consuming less power and therefore producing less thermal energy. Such a decision may be made, for example, even though temperature of electronic device 102 remains above a threshold at which controller 110 would otherwise maintain or increase fan speed to maintain or increase cooling of electronic device 102. Furthermore, controller 110 may, for example, alter the pulse width in the control signal to raise the fan speed in accordance with increased change in power usage of electronic device 102 on the expectation that more cooling effect is needed because electronic device 102 is consuming more power and therefore producing more thermal energy. Such a decision may be made, for example, even though temperature of electronic device 102 remains below a threshold at which controller 110 would otherwise maintain or decrease fan speed to maintain or decrease cooling of electronic device 102. Accordingly, controller 110 may take into account a change in power usage that has not yet manifested itself into a change in temperature.

Figure 2:
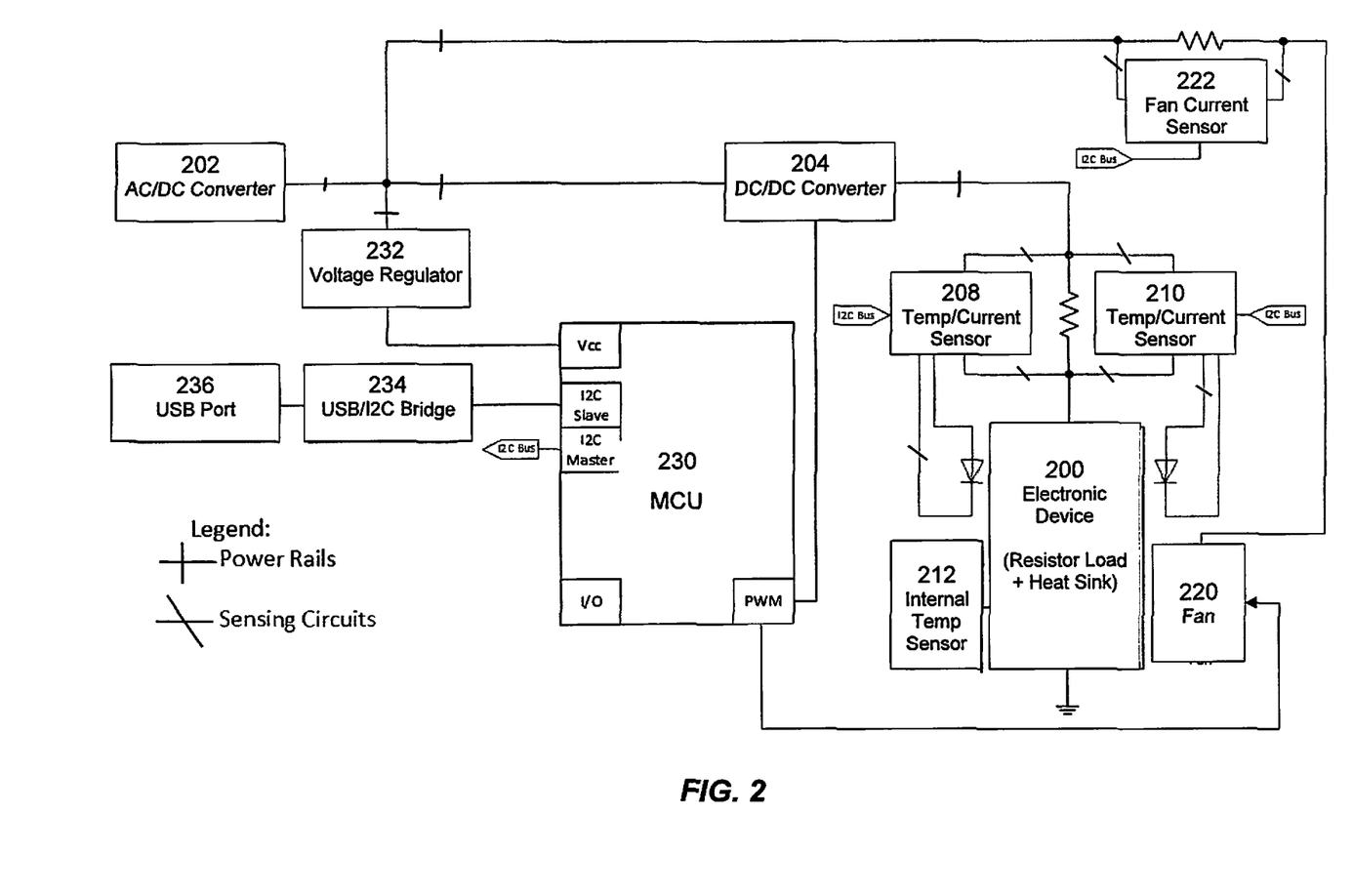
FIG. 2 illustrates another exemplary apparatus for reducing power consumption of a cooling system for an electronic device, according to embodiments of the present disclosure.

FIG. 2 illustrates another exemplary apparatus for reducing power consumption of a cooling system for an electronic device 200, according to embodiments of the present disclosure. Electronic device 200 may receive direct current (DC) via a typical power supply arrangement; for example, an alternating current (AC) power supply (not shown) may provide AC current to an AC/DC converter 202 that produces a first DC signal (e.g., at 12V/40 W), and a DC/DC converter 204 (which may be, e.g., a Microchip Technology, Inc. ("Microchip") MIC45116) may receive and modify the first DC current (e.g., step down the voltage to 2-10V) and supply a second DC current to electronic device 200.

One or more sensors 208, 210 may be electrically connected to the power rail for the electronic device 200 in order to measure temperature, current consumption/power usage, or both. In various embodiments, a first sensor 208 may measure temperature of the electronic device 200 and a second sensor 210 may measure power usage of the electronic device 200, or vice versa, or both sensors 208, 210 may each measure both temperature and power usage. Only one such sensor might be used in various embodiments. Sensors 208, 210 (which may, together with an internal temperature sensor 212, be, e.g., an EMC1704, EMC 14xx, PAC1921, and similar sensors, by Microchip or other suitable combinations of analog and digital circuitry) may generate one or more temperature values and one or more power usage values and may send the values to the microcontroller 230 (e.g., via I2C bus). The value may be sent for diagnostics purposes. Although an I2C bus is shown as an example, any suitable bus may be used.

AC/DC converter 202 may also be configured to supply the first DC signal to power a fan 220 of the cooling system. In some embodiments, a fan current sensor 222 may be electrically connected to the power rail for the fan 220 in order to measure a fan power usage. The fan current sensor 222 (which may be, e.g., a Microchip PAC1921) may produce a fan power usage value and send the value to the microcontroller 230 (e.g., via I2C bus). Sensor 222 may be implemented in any suitable analog or digital circuitry. Sensor 222 may be configured to operate as a tachometer, wherein the reading from sensor 222 may be correlated to a fan speed of fan 220.

AC/DC converter 202 may be configured to further supply power to a microcontroller 230 of the cooling system. A voltage regulator 232, such as a Microchip MIC5209 or similar suitable linear low-dropout regulator, may be used to maintain a steady voltage supplied to microcontroller 230. Microcontroller 230 may be implemented by any suitable microcontroller for receiving sensor inputs, providing a pulse-width modulated control signal to the fan 220, and executing the computations and algorithms described herein in order to determine the optimal parameters of the PWM control signal. Exemplary microcontrollers include a Microchip PIC32MX series 32-bit microcontroller, which includes a PWM output and an I2C slave/master interface. A controller board mounting the microcontroller 230 may further have a Universal Serial Bus (USB)-to-I2C bridge 234 and a USB port 236 to facilitate connection of external computing devices that are configured to interface with the microcontroller 230.

Microcontroller 230 may implement controller 110 of FIG. 1. The implementation may be included in, for example, instructions for execution by a processor of microcontroller 230. Moreover, the implementation may be included in logic embedded in microcontroller 230.

Figure 3:
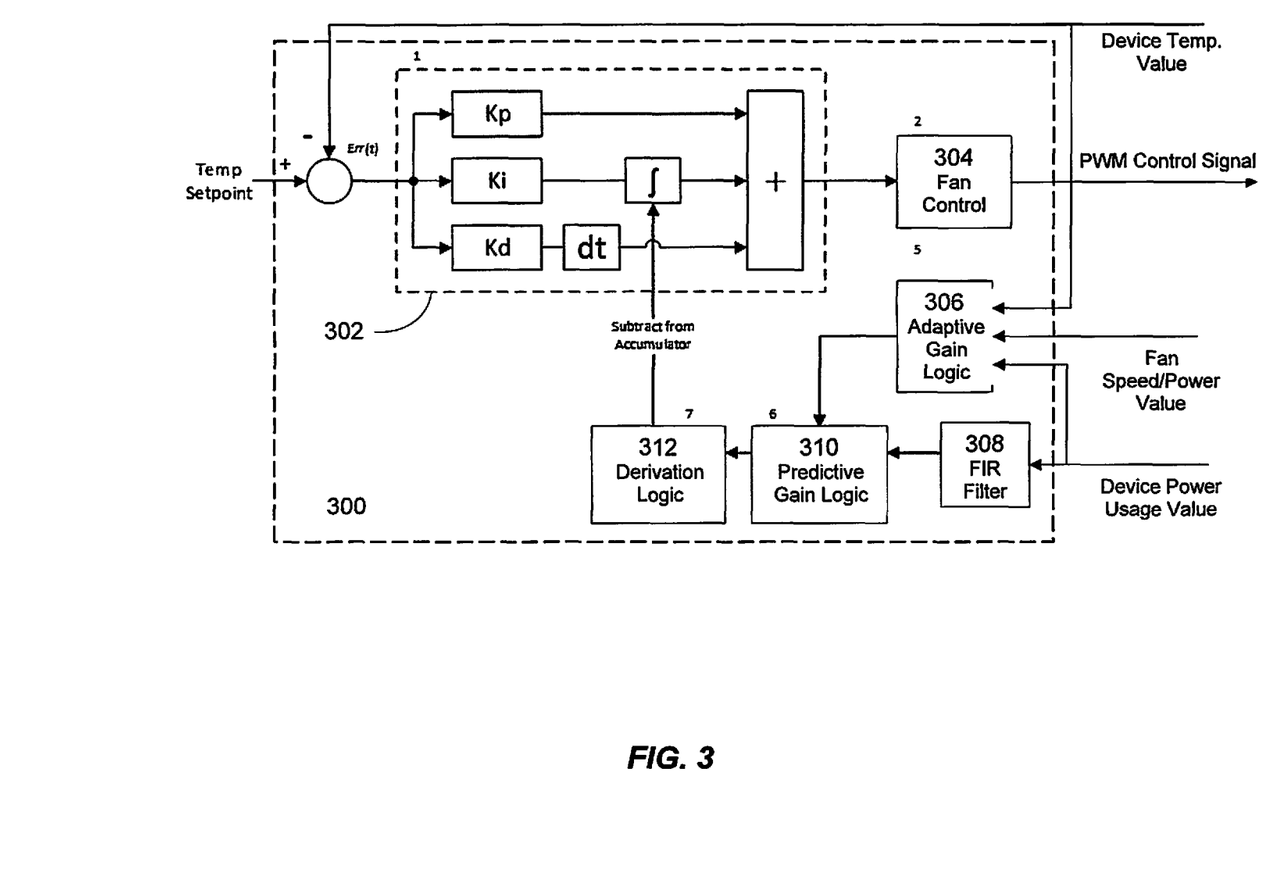
FIG. 3 illustrates a logic diagram of a proportional integrative derivative (PID) controller, according to embodiments of the present disclosure.

FIG. 3 illustrates a logic diagram of a proportional integrative derivative (PID) controller 300, according to embodiments of the present disclosure. Controller 300 may be illustrated by a logic diagram and refer to operation by microcontroller 230 of FIG. 2. FIG. 3 illustrates the input values and the algorithmic processing of controller 300 in order to produce a fan (or other output) control signal that reduces power consumption as described herein. The illustrated logic blocks represent combinations of program instructions and circuit components that provide the described functionality.

A PID control block 302 includes a proportional gain $K_p$, an integrative gain $K_i$, and a derivative gain $K_d$. Such gains may be common to PID controllers, though the present disclosure may apply unique elements to these gains. The gains may have a temperature setpoint as an input and a setpoint for fan speed as output. A device temperature value from a sensor or monitor may also be input. A difference or error signal between the temperature setpoint and the device temperature value may be calculated and passed to the gains of the PID.

The integrative gain $K_i$ may further pass its output through an integrative accumulator. The derivative gain $K_d$ may further pass its output through a derivative accumulator. These accumulators may refine the setpoint according to a trend of recent historical recorded values from the temperature sensor that monitors temperature of the electronic device. The output of PID control block 302, the PID output, drives the fan speed to deliver the cooling to the final load. Fan control block 304 may translate the received PID signal into a PWM control signal having the necessary parameters to set the fan to the corresponding speed. Fan control block 304 may send the PWM control signal to the fan (not shown).

In one embodiment, PID control block 302 may also take into account power usage values produced by a power sensor that measures the real-time power usage of the electronic device. Fan speed or a power reading value may be provided to adaptive gain logic 306, reflecting the present speed or power usage of the fan. Furthermore, device temperature may be provided to adaptive gain logic 306.

Moreover, device power usage from previous measurements or points in time may be provided to adaptive gain logic 306.

Adaptive gain logic block 306 may normalize the input values according to an adaptive gain function and output an adaptive gain value to a predictive gain logic block 310. The power usage value of the device may also be received by a finite impulse response (FIR) filter 308, which may be configured to smooth the raw data of the power usage value and provide a filtered power usage value to predictive gain logic block 310.

Predictive gain logic block 310 may perform iterative processing of the adaptive gain value and the filtered power usage value to produce a continuously updated output signal comprising a predicted minimum fan speed based on the power usage of the electronic device as a function of time. The output signal may be delivered to a derivation logic block 312, which may be configured to derive the output signal to determine the slope of the predictive function. If the slope is negative, derivation logic block 312 may be configured to output a signal comprising a reduction value that represents the amount the fan speed can be reduced in view of the decreasing power usage by the electronic device. If the slope is positive, derivation logic block 312 may be configured to output a signal comprising an incremental value that represents the amount the fan speed can be increased in view of the increasing power usage by the electronic device. For every iteration in which derivation logic block 312 outputs a signal, the signal may be delivered to PID control block 302. In one embodiment, derivation logic block 312 may output its signal to the integrative accumulator of PID control block 302. The signal from derivation logic block 312 may be subtracted from the accumulated value in the integrative accumulator. This in turn may reduce the output PID signal for the fan speed, making the fan run slower and consume less power.

Figure 4:
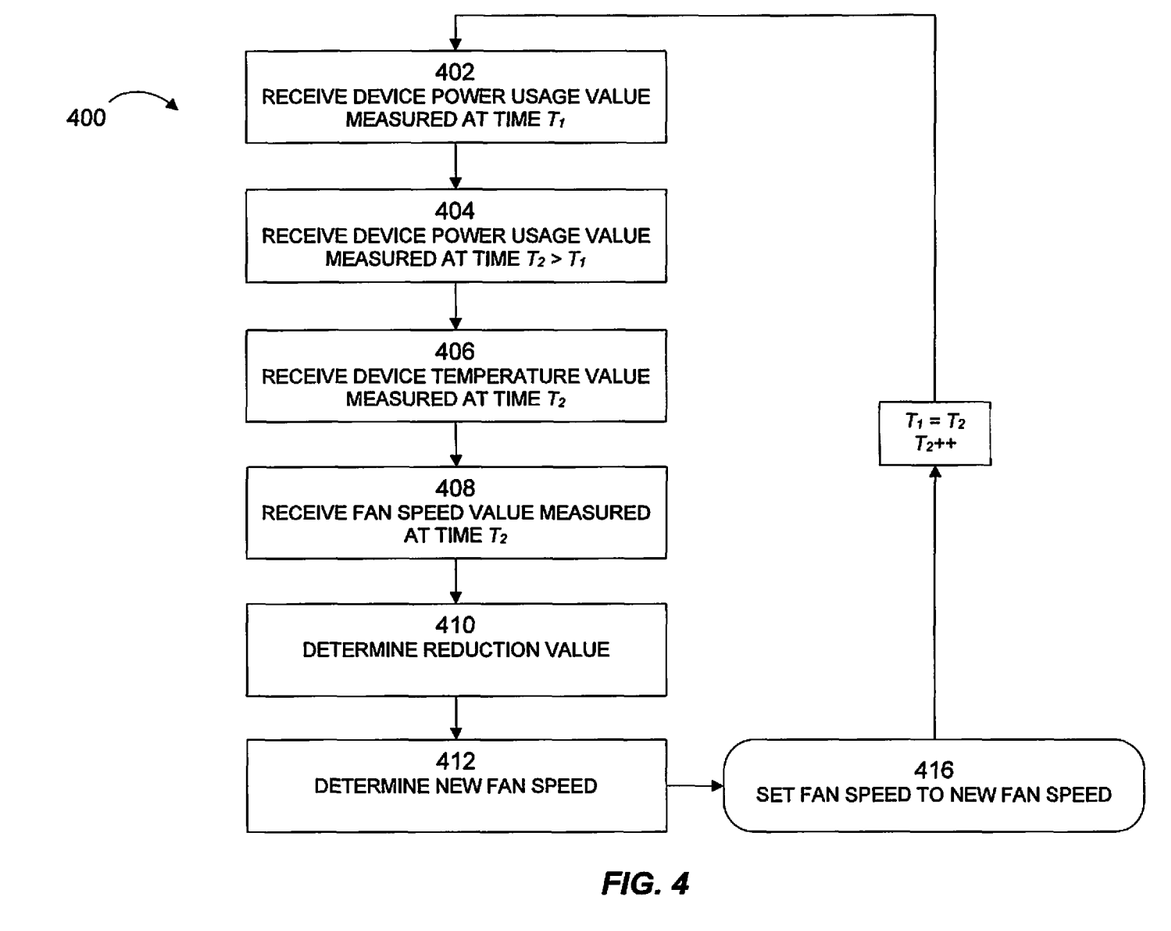
FIG. 4 is a flowchart illustrating a method for cooling a system, according to embodiments of the present disclosure.

FIG. 4 is a flowchart illustrating a method 400 in which the above functionality is performed by a microcontroller, according to embodiments of the present disclosure. At step 402, the microcontroller may receive a device power usage value representing power usage of the electronic device at a first time $T_1$. At step 404, the microcontroller may receive a power usage value representing power usage of the electronic device at a second time $T_2$ subsequent to the first time $T_1$. At step 406, the microcontroller may receive a temperature value representing a temperature of the electronic device at the second time $T_2$. At step 408, the microcontroller may receive a present fan speed value representing a rotation speed of a fan of the cooling system at the second time $T_2$. At step 410, the microcontroller may determine, from the power usage values and optionally also from the temperature value and the fan speed value as described above with respect to FIG. 3, a reduction or increase value representing an amount that the power usage of the electronic device decreased or increased from the first time to the second time. At step 412, the microcontroller determines, from the reduction or increase value, a new fan speed lower or higher than the present fan speed. At step 416, the microcontroller controls the fan to rotate at the new fan speed. Method 400 may optionally terminate or may be repeated for an indeterminate number of continuous iterations.

Although a specific number and sequence of steps of method 400 are shown, more or fewer steps may be taken. Furthermore, the steps of method 400 may be rearranged and conducted in other suitable orders. One or more steps of method 400 may be repeated, omitted, or executed in parallel or with each other. One or more steps of method 400 or method 400 may be executed recursively. Method 400 may begin at any suitable point, such as at step 402.

Method 400 may be implemented as instructions for execution by a processor that are embodied in one or more computer-readable media such as a memory. The instructions, when loaded and executed by the processor, may cause the microcontroller or processor to implement the functionality of the present disclosure.

Figure 5:
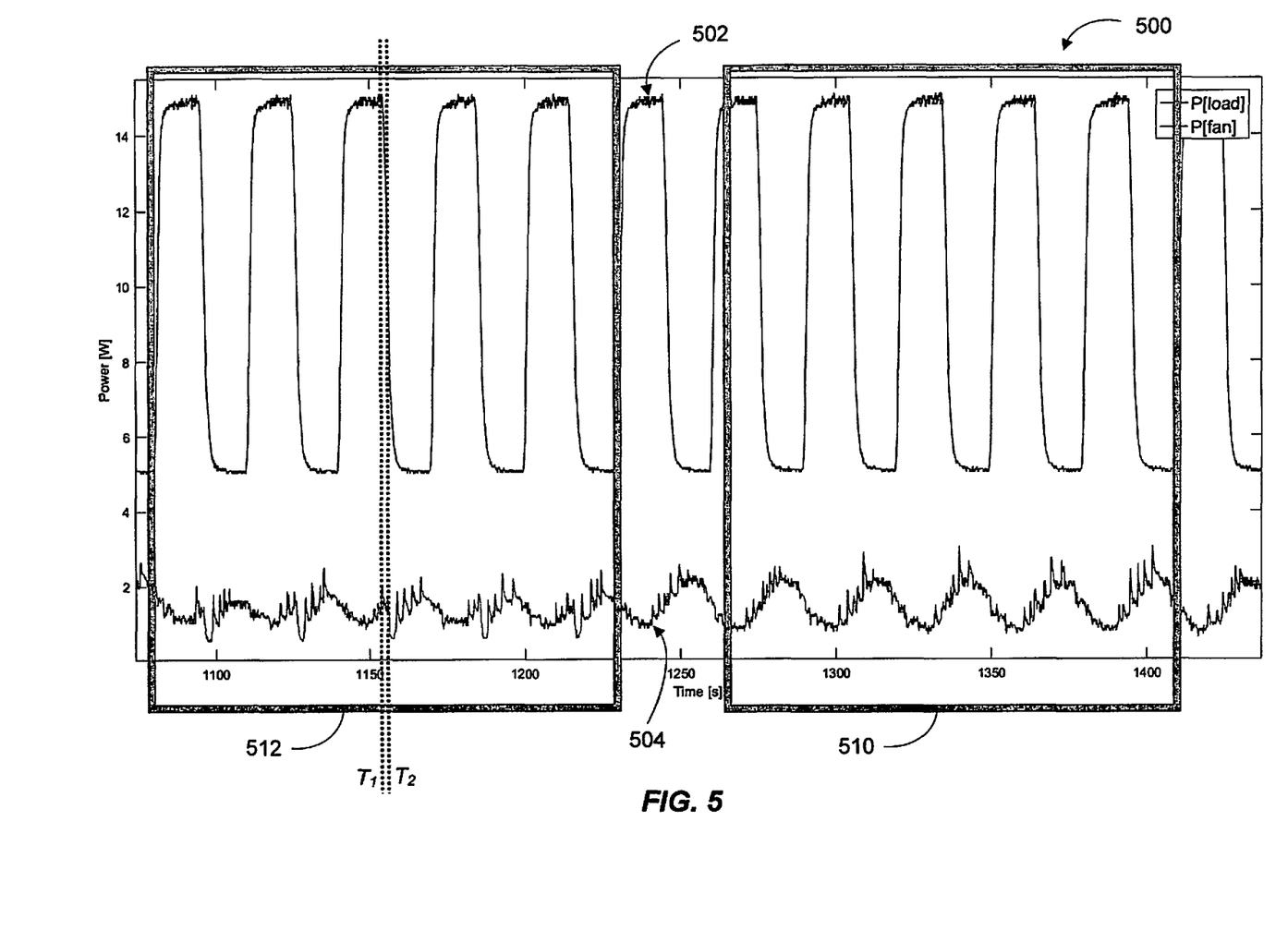
FIG. 5 illustrates a plot showing exemplary recorded power usage values for an electronic device and a fan over time, according to embodiments of the present disclosure.

FIG. 5 illustrates a plot 500 showing exemplary recorded power usage values for an electronic device (line 502) and a fan (line 504) over time, according to embodiments of the present disclosure. FIG. 5 illustrates example performance of the embodiments shown above. Region 510 represents the power usage values recorded when an existing cooling system power controller and control logic are used; the fan consistently ramps up to a maximum speed and power consumption after the peak power usage of the electronic device, ostensibly when the temperature is at its highest. In contrast, region 512 demonstrates an approximately 15% lower fan power consumption when the apparatus and methods of the present disclosure are used. An exemplary time $T_1$ is marked when the electronic device power usage is at its peak, and the fan power usage is increasing; within a few seconds, at an exemplary time $T_2$, the slope of the derivative of the power usage becomes strongly negative, and the fan power consumption subsequently drops sharply in response as the controller reduces the fan speed.

Accordingly, fan power may be reduced in advance of cooling of the electronic device. By adding a power measurement sensor to loads, it is thus possible to predictively sense that temperature will increase or decrease in that load. The system takes power sensor data and weights it against PID temperature control feedback, enabling more than 15% reduction in fan power consumption in specific testing scenarios such as these in FIG. 5.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

We claim:

1. A power controller, comprising instructions, the instructions, when loaded and executed by a processor, cause the processor to:
receive a power consumption value indicating power consumption of an electronic device;
receiving a temperature and a temperature setpoint value of the electronic device;
determine, based on the power consumption value and a stored previous power consumption value, a change value representing an amount that power consumption of the electronic device changed from a previous power consumption of the electronic device;
determine an output cooling control value using a proportional-integrative-derivative control loop receiving said device temperature and said temperature setpoint value;
adjusting the output cooling control value by subtracting a value based on the change value from an integrative accumulator of the PID control loop; and control an output for cooling the electronic device using the output cooling control value.

2. The power controller of claim 1, wherein the output cooling control value is a fan speed.

3. The power controller of claim 1, wherein:
the processor was caused to cool the electronic device at the previous power consumption at a first fan speed during a period of time;
the change value is a reduction in power consumption; and
the output cooling value represents a second fan speed lower than the first fan speed.

4. The power controller of claim 1, wherein:
the processor was caused to cool the electronic device at the previous power consumption at a first fan speed during a period of time;
the change value is an increase in power consumption; and
the output cooling value represents a second fan speed higher than the first fan speed.

5. The power controller of claim 1, wherein:
the processor was caused to cool the electronic device at the previous power consumption at a first fan speed during a period of time;
the change value is a reduction in power consumption;
the output cooling value represents a second fan speed lower than the first fan speed; and
the processor received temperature data indicating that the temperature had not decreased.

6. The power controller of claim 1, wherein the processor is further caused to perform finite impulse response FIR filtering of the power consumption value.

7. The power controller of claim 6, wherein the processor is further caused to:
calculate an adaptive gain from the electronic device temperature value, a fan speed value and the power consumption value.

8. The power controller of claim 7, wherein the processor is further caused to:
iteratively process of the adaptive gain and the filtered power consumption value to produce a continuously updated output signal comprising a predicted minimum fan speed.

9. The power controller of claim 8, wherein the continuously updated output signal is derivated to determine the slope of a predictive function, wherein the derivated signal is subtracted from the integrative accumulator of the PID control loop.

10. A microcontroller, comprising:
a processor; and
instructions in a computer-readable medium, the instructions, when loaded and executed by a processor, cause the processor to:
receive a power consumption value indicating power consumption of an electronic device;
receive a temperature and a temperature setpoint value of the electronic device;
determine, based on the power consumption value and a stored previous power consumption value, a change value representing an amount that power consumption of the electronic device changed from a previous power consumption of the electronic device;
determine an output cooling control value using a proportional-integrative-derivative control loop receiving said device temperature and said temperature setpoint value,
adjusting the output cooling control value by subtracting a value based on the change value from an integrative accumulator of the PID control loop; and
control an output for cooling the electronic device using the output cooling control value.

11. The microcontroller of claim 10, wherein the output cooling control value is a fan speed.

12. The microcontroller of claim 10, wherein:
the processor was caused to cool the electronic device at the previous power consumption at a first fan speed during a period of time;
the change value is a reduction in power consumption; and
the output cooling value represents a second fan speed lower than the first fan speed.

13. The microcontroller of claim 10, wherein:
the processor was caused to cool the electronic device at the previous power consumption at a first fan speed during a period of time;
the change value is an increase in power consumption; and
the output cooling value represents a second fan speed higher than the first fan speed.

14. The microcontroller of claim 10, wherein:
the processor was caused to cool the electronic device at the previous power consumption at a first fan speed during a period of time;
the change value is a reduction in power consumption;
the output cooling value represents a second fan speed lower than the first fan speed; and
the processor received temperature data indicating that the temperature had not decreased.

15. The microcontroller of claim 10, wherein the processor is further caused to perform finite impulse response FIR filtering of the power consumption value.

16. The microcontroller of claim 10, wherein the processor is further caused to:
calculate an adaptive gain from the electronic device temperature value, a fan speed value and the power consumption value.

17. The microcontroller of claim 16, wherein the processor is further caused to:
iteratively process of the adaptive gain and the filtered power consumption value to produce a continuously updated output signal comprising a predicted minimum fan speed.

18. The microcontroller of claim 17, wherein the continuously updated output signal is derivated to determine the slope of a predictive function, wherein the derivated signal is subtracted from the integrative accumulator of the PID control loop.

19. A method for cooling an electronic device, the method including:
receiving a load power consumption value indicating power consumption of the electronic device;
receiving a temperature value and a temperature setpoint value of the electronic device;
determining, based on the load power consumption value and a stored previous power consumption value, a change value representing an amount that power consumption of the electronic device changed from a previous power consumption of the electronic device;
determining an output cooling control value using a proportional-integrative-derivative control loop receiving said device temperature and said temperature setpoint value, adjusting the output cooling control value by subtracting a value based on the change value from an integrative accumulator of the PID control; and controlling an output for cooling the electronic device using the output cooling control value.

20. The method of claim 19 further comprising cooling the electronic device during a time period comprising the previous power consumption at a first fan speed, wherein:

the change value is a reduction in power consumption;

the output cooling value represents a second fan speed lower than the first fan speed; and temperature data was previously received indicating that the temperature had not decreased.

21. The method of claim 19, further comprising filtering of the power consumption value.

22. The method of claim 21, further comprising:

calculating an adaptive gain from the device temperature value, a fan speed value and the power consumption value, and iteratively processing of the adaptive gain and the filtered power consumption value to produce a continuously updated output signal comprising a predicted minimum fan speed.

23. The method of claim 22, wherein the continuously updated output signal is derivated to determine the slope of a predictive function, wherein the derivated signal is subtracted from the integrative accumulator of the PID control loop.

* * * * *